United States Patent
Wang et al.

(10) Patent No.: US 12,278,619 B2
(45) Date of Patent: Apr. 15, 2025

(54) FILTER WITH BULK ACOUSTIC WAVE DEVICE HAVING RAISED FRAME STRUCTURE

(71) Applicant: Skyworks Solutions, Inc., Irvine, CA (US)

(72) Inventors: Yiliu Wang, Irvine, CA (US); Jiansong Liu, Fremont, CA (US); Nan Wu, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 361 days.

(21) Appl. No.: 17/549,511

(22) Filed: Dec. 13, 2021

(65) Prior Publication Data
US 2022/0209749 A1    Jun. 30, 2022

Related U.S. Application Data

(60) Provisional application No. 63/131,696, filed on Dec. 29, 2020, provisional application No. 63/131,692, filed on Dec. 29, 2020.

(51) Int. Cl.
| | |
|---|---|
| *H03H 9/54* | (2006.01) |
| *H03H 9/02* | (2006.01) |
| *H03H 9/13* | (2006.01) |
| *H03H 9/17* | (2006.01) |
| *H03H 9/62* | (2006.01) |
| *H03H 9/64* | (2006.01) |

(52) U.S. Cl.
CPC .......... *H03H 9/54* (2013.01); *H03H 9/02007* (2013.01); *H03H 9/13* (2013.01); *H03H 9/171* (2013.01); *H03H 9/62* (2013.01); *H03H 9/6433* (2013.01)

(58) Field of Classification Search
CPC ........ H03H 9/54; H03H 9/02007; H03H 9/13; H03H 9/171; H03H 9/62; H03H 9/6433; H03H 9/587; H03H 9/605; H03H 9/02118
USPC .......................................... 333/133, 187, 188
See application file for complete search history.

(56) References Cited

U.S. PATENT DOCUMENTS

| | | | |
|---|---|---|---|
| 8,896,395 B2 | 11/2014 | Burak et al. | |
| 9,490,771 B2 | 11/2016 | Burak et al. | |
| 9,660,609 B2 | 5/2017 | Reisner et al. | |
| 10,250,228 B2 | 4/2019 | Chang et al. | |
| 10,886,888 B2 * | 1/2021 | Ivira | H03H 9/02102 |
| 11,764,750 B2 * | 9/2023 | Hou | H03H 3/02 |
| | | | 310/341 |
| 2011/0298564 A1 * | 12/2011 | Iwashita | H03H 9/173 |
| | | | 333/187 |
| 2016/0227603 A1 | 8/2016 | Huang et al. | |
| 2017/0244021 A1 | 8/2017 | Han et al. | |
| 2019/0182894 A1 | 6/2019 | Huang et al. | |
| 2020/0099359 A1 * | 3/2020 | Shin | H03H 9/173 |

(Continued)

*Primary Examiner* — Jorge L Salazar, Jr.
(74) *Attorney, Agent, or Firm* — Knobbe, Martens, Olson & Bear, LLP

(57) ABSTRACT

A filter with bulk acoustic wave devices is disclosed. The filter includes a first bulk acoustic wave resonator and a second bulk acoustic wave resonator. The first bulk acoustic wave resonator includes a first raised frame structure. The first raised frame structure is a multi-layer raised frame structure. The second bulk acoustic wave resonator includes a second raised frame structure. The first raised frame structure has at least one more raised frame layer than the second raised frame structure.

20 Claims, 9 Drawing Sheets

(56) References Cited

U.S. PATENT DOCUMENTS

| | | |
|---|---|---|
| 2020/0373901 A1 | 11/2020 | Liu et al. |
| 2020/0373911 A1 | 11/2020 | Wang et al. |
| 2020/0395911 A1* | 12/2020 | Liu .................. H03H 9/175 |
| 2021/0028765 A1 | 1/2021 | Wang et al. |
| 2021/0083643 A1 | 3/2021 | Liu et al. |
| 2021/0111692 A1 | 4/2021 | Liu et al. |
| 2021/0126619 A1 | 4/2021 | Wang et al. |
| 2021/0126625 A1 | 4/2021 | Wang et al. |
| 2021/0344321 A1 | 11/2021 | Shin et al. |
| 2022/0094323 A1 | 3/2022 | Zhang et al. |
| 2022/0094324 A1 | 3/2022 | Zhang et al. |
| 2022/0094335 A1 | 3/2022 | Zhang et al. |
| 2022/0103150 A1 | 3/2022 | Shin et al. |
| 2022/0103151 A1 | 3/2022 | Shin et al. |
| 2022/0103152 A1 | 3/2022 | Shin et al. |
| 2022/0103159 A1 | 3/2022 | Shin et al. |
| 2022/0200571 A1 | 6/2022 | Wang et al. |
| 2022/0200572 A1 | 6/2022 | Wang et al. |
| 2022/0209743 A1 | 6/2022 | Liu et al. |
| 2022/0209747 A1 | 6/2022 | Wang et al. |
| 2022/0209749 A1 | 6/2022 | Wang et al. |

\* cited by examiner

FILTER WITH BULK ACOUSTIC WAVE DEVICE HAVING RAISED FRAME STRUCTURE

CROSS REFERENCE TO PRIORITY APPLICATION

This application claims the benefit of priority of U.S. Provisional Patent Application No. 63/131,696, filed Dec. 29, 2020 and titled "FILTER WITH BULK ACOUSTIC WAVE DEVICE HAVING RAISED FRAME STRUCTURE," and U.S. Provisional Patent Application No. 63/131,692, filed Dec. 29, 2020 and titled "FILTERS WITH BULK ACOUSTIC WAVE DEVICES," the disclosures of which are hereby incorporated by reference in their entirety herein.

BACKGROUND

Technical Field

Embodiments of this disclosure relate to acoustic wave devices and, more specifically, to filters that include bulk acoustic wave devices.

Description of Related Technology

Acoustic wave filters can be implemented in radio frequency electronic systems. For instance, filters in a radio frequency front end of a mobile phone can include one or more acoustic wave filters. A plurality of acoustic wave filters can be arranged as a multiplexer. For instance, two acoustic wave filters can be arranged as a duplexer.

An acoustic wave filter can include a plurality of acoustic resonators arranged to filter a radio frequency signal. Example acoustic wave filters include surface acoustic wave (SAW) filters and bulk acoustic wave (BAW) filters. BAW filters include BAW resonators. Example BAW resonators include film bulk acoustic wave resonators (FBARs) and solidly mounted resonators (SMRs). In BAW resonators, acoustic waves propagate in a bulk of a piezoelectric layer.

For high performance BAW devices, achieving performance specifications can be challenging.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a filter with bulk acoustic wave devices is disclosed. The filter can include a first bulk acoustic wave resonator and a second bulk acoustic wave resonator. The first bulk acoustic wave resonator includes a first raised frame structure. The first raised frame structure is a multi-layer raised frame structure. The second bulk acoustic wave resonator includes a second raised frame structure. The first raised frame structure has at least one more raised frame layer than the second raised frame structure.

In one embodiment, the first raised frame structure is a dual-layer raised frame structure and the second raised frame structure is a single layer raised frame structure.

In one embodiment, the second bulk acoustic wave resonator has less mass loading than the first bulk acoustic wave resonator in a frame region.

In one embodiment, the first raised frame structure includes a gradient raised frame structure.

In one embodiment, the first raised frame structure includes a multi-gradient raised frame structure.

In one embodiment, the first bulk acoustic wave resonator includes a first electrode, a second electrode, and a piezoelectric layer that is positioned between the first electrode and the second electrode. The first raised frame structure can include a first layer that is positioned between the second electrode and the piezoelectric layer. A second layer of the first raised frame structure can be positioned over the second electrode such that the second electrode is positioned between the first layer and the second layer. The first layer can include an oxide and the second layer includes a metal. The first layer has a lower acoustic impedance than the piezoelectric layer.

In one embodiment, the filter is a band pass filter. The first bulk acoustic wave resonator can be a shunt resonator and the second bulk acoustic wave resonator is a series resonator. The filter can further include a plurality of shunt bulk acoustic wave resonators that are coupled to the first bulk acoustic wave resonator, and a plurality of series resonators that are coupled to the second bulk acoustic wave resonator.

In one embodiment, the filter is a band rejection filter. The first bulk acoustic wave resonator can be a series resonator and the second bulk acoustic wave resonator is a shunt resonator. The filter can further include a plurality of series bulk acoustic wave resonators that are coupled to the first bulk acoustic wave resonator, and a plurality of shunt resonators that are coupled to the second bulk acoustic wave resonator.

In one embodiment, the first raised frame structure includes an oxide layer that is in contact with a piezoelectric layer of the first bulk acoustic wave resonator, and the second raised frame structure does not include an oxide layer that is in contact with a piezoelectric layer in an active region of the second bulk acoustic wave resonator.

In one embodiment, the first bulk acoustic wave resonator includes a recessed frame structure between a main acoustically active region and the first raised frame structure.

In one embodiment, the second bulk acoustic wave resonator includes a recessed frame structure between a main acoustically active region and the second raised structure.

In one aspect, a radio frequency module is disclosed. the radio frequency module can include any filter disclosed herein. The radio frequency module can include a radio frequency circuit element coupled to the filter. The filter and the radio frequency circuit element can be enclosed within a common package. The radio frequency circuit element can be a radio frequency amplifier arranged to amplify a radio frequency signal. The radio frequency amplifier can be a low noise amplifier. The radio frequency amplifier can be a power amplifier. The radio frequency module can further include a switch that is configured to selectively couple a terminal of the filter to an antenna port of the radio frequency module. The radio frequency circuit element can be a switch that is configured to selectively couple the filter to an antenna port of the radio frequency module.

In one aspect, a wireless communication device is disclosed. The wireless communication device can include any filter disclosed herein. The wireless communication device can include an antenna operatively that is coupled to the filter, a radio frequency amplifier that is operatively coupled to the filter and configured to amplify a radio frequency signal, and a transceiver that is in communication with the radio frequency amplifier.

In one aspect, a method of filtering a radio frequency signal is disclosed. The method can include receiving a radio frequency signal at a port of any filter disclosed herein, and filtering the radio frequency signal with the filter.

In one aspect, a radio frequency module is disclosed. The radio frequency module can include a filter. The filter includes a first bulk acoustic wave resonator that includes a first raised frame structure, and a second bulk acoustic wave resonator that includes a second raised frame structure. The first raised frame structure is a multi-layer raised frame structure. The first raised frame structure has at least one more raised frame layer than the second raised frame structure. The radio frequency module can include a radio frequency circuit element coupled to the filter. The filter and the radio frequency circuit element being enclosed within a common package.

In one embodiment, the radio frequency circuit element is a radio frequency amplifier that is arranged to amplify a radio frequency signal.

In one embodiment, the radio frequency circuit element is a switch that is configured to selectively couple the filter to an antenna port of the radio frequency module.

In one aspect, a wireless communication device is disclosed. The wireless communication device can include a filter, an antenna that is operatively coupled to the filter, a radio frequency amplifier that is operatively coupled to the filter and configured to amplify a radio frequency signal, and to transceiver that is in communication with the radio frequency amplifier comprising. The filter include a first bulk acoustic wave resonator that includes a first raised frame structure. The first raised frame structure is a multi-layer raised frame structure. The filter includes a second bulk acoustic wave resonator that includes a second raised frame structure. The first raised frame structure has at least one more raised frame layer than the second raised frame structure.

In one embodiment, the filter is a band pass filter or a band rejection filter, wherein, when the filter is the band pass filter, the first bulk acoustic wave resonator is a shunt resonator and the second bulk acoustic wave resonator is a series resonator, and wherein, when the filter is the band rejection filter, the first bulk acoustic wave resonator is a series resonator and the second bulk acoustic wave resonator is a shunt resonator.

In one aspect, a band pass filter with bulk acoustic wave resonators is disclosed. The band pass filter can include a shunt bulk acoustic wave resonator that includes a first raised frame structure. The shunt bulk acoustic wave resonator has a first resonant frequency and a first anti-resonant frequency. The band pass filter can include a series bulk acoustic wave resonator that includes a second raised frame structure. The second raised frame structure is different than the first raised frame structure. The series bulk acoustic wave resonator has a second resonant frequency and a second anti-resonant frequency. The second raised frame structure contributes to the series bulk acoustic wave resonator to have a higher quality factor below the second resonant frequency than the shunt bulk acoustic wave resonator has below the first resonant frequency. The band pass filter has a pass band.

In one embodiment, the first raised frame structure contributes to the shunt bulk acoustic wave resonator to have a higher quality factor between the first resonant frequency and the first anti-resonant frequency than the series bulk acoustic wave resonator has between the second resonant frequency and the second anti-resonant frequency.

In one embodiment, the second raised frame structure provides less mass loading than the first raised frame structure.

In one embodiment, the first raised frame structure has at least one more raised frame layers than the second raised frame structure.

In one embodiment, the first raised frame structure is a dual-layer raised frame structure and the second raised frame structure is a single raised frame structure.

In one embodiment, the first raised frame structure includes a gradient raised frame structure.

The first raised frame structure can include a multi-gradient raised frame structure.

The shunt bulk acoustic wave resonator can include a first electrode, a second electrode, and a piezoelectric layer positioned between the first electrode and the second electrode. The first raised frame structure can include a first layer positioned between the second electrode and the piezoelectric layer.

The second electrode can be positioned between the first layer and the second layer.

The first layer can include an oxide and the second layer can include a metal.

The first layer can have a lower acoustic impedance than the piezoelectric layer.

In one embodiment, the band pass filter further includes a plurality of additional shunt bulk acoustic wave resonators that are coupled to the shunt bulk acoustic wave resonator, and a plurality of additional series resonators that are coupled to the series bulk acoustic wave resonator.

In one embodiment, the first raised frame structure includes an oxide layer that is in contact with a piezoelectric layer of the shunt bulk acoustic wave resonator, and the second raised frame structure does not include an oxide layer that is in contact with a piezoelectric layer in an active region of the series bulk acoustic wave resonator.

The first bulk acoustic wave resonator can include a recessed frame structure between a main acoustically active region and the first raised frame structure.

The second bulk acoustic wave resonator can include a recessed frame structure between a main acoustically active region and the second raised frame structure.

In one aspect, a band rejection filter with bulk acoustic wave resonators is disclosed. The band rejection filter can include a series bulk acoustic wave resonator that includes a first raised frame structure. The series bulk acoustic wave resonator has a first resonant frequency and a first anti-resonant frequency. The band rejection filter can include a shunt bulk acoustic wave resonator that includes a second raised frame structure. The second raised frame structure is different than the first raised frame structure. The shunt bulk acoustic wave resonator has a second resonant frequency and a second anti-resonant frequency. The second raised frame structure contributes to the shunt bulk acoustic wave resonator to have a higher quality factor below the second resonant frequency than the series bulk acoustic wave resonator has below the first resonant frequency. The band pass filter has a rejection band.

In one embodiment, the first raised frame structure contributes to the series bulk acoustic wave resonator having a higher quality factor between the first resonant frequency and the first anti-resonant frequency than the shunt bulk acoustic wave resonator has between the second resonant frequency and the second anti-resonant frequency.

In one embodiment, the second raised frame structure provides less mass loading than the first raised frame structure.

In one embodiment, the first raised frame structure has at least one more raised frame layers than the second raised frame structure.

In one embodiment, the first raised frame structure is a dual-layer raised frame structure and the second raised frame structure is a single raised frame structure.

In one embodiment, the first raised frame structure includes a gradient raised frame structure.

The first raised frame structure can include a multi-gradient raised frame structure.

In one embodiment, the series bulk acoustic wave resonator includes a first electrode, a second electrode, and a piezoelectric layer that is positioned between the first electrode and the second electrode. The first raised frame structure can include a first layer positioned between the second electrode and the piezoelectric layer.

The second electrode can be positioned between the first layer and the second layer.

The first layer can include an oxide and the second layer can include a metal.

The first layer can have a lower acoustic impedance than the piezoelectric layer.

In one embodiment, the band rejection filter further includes a plurality of additional series bulk acoustic wave resonators that are coupled to the series bulk acoustic wave resonator, and a plurality of additional bulk resonators that are coupled to the series bulk acoustic wave resonator.

In one embodiment, the first raised frame structure includes an oxide layer that is in contact with a piezoelectric layer of the series bulk acoustic wave resonator, and the second raised frame structure does not include an oxide layer that is in contact with a piezoelectric layer in an active region of the shunt bulk acoustic wave resonator.

In one embodiment, the first bulk acoustic wave resonator includes a recessed frame structure between a main acoustically active region and the first raised frame structure.

In one embodiment, the second bulk acoustic wave resonator includes a recessed frame structure between a main acoustically active region and the second raised frame structure.

In one aspect, a radio frequency module is disclosed. The radio frequency module can include any filter disclosed herein, and a radio frequency circuit element that is coupled to the filter. The filter and the radio frequency circuit element are enclosed within a common package.

In one embodiment, the radio frequency circuit element is a radio frequency amplifier arranged to amplify a radio frequency signal.

The radio frequency amplifier can be a low noise amplifier.

The radio frequency amplifier can be a power amplifier.

The radio frequency module further can include a switch that is configured to selectively couple a terminal of the filter to an antenna port of the radio frequency module.

In one embodiment, the radio frequency circuit element is a switch that is configured to selectively couple the filter to an antenna port of the radio frequency module.

In one aspect, a wireless communication device is disclosed. The wireless communication device can include any filter disclosed herein, an antenna that is operatively coupled to the filter, a radio frequency amplifier that is operatively coupled to the filter and configured to amplify a radio frequency signal, and a transceiver that is in communication with the radio frequency amplifier.

In one aspect, a method of filtering a radio frequency signal is disclosed. The method can include receiving a radio frequency signal at a port of any filter disclosed herein. Filtering the radio frequency signal with the filter.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

The present disclosure relates to U.S. patent application Ser. No. 17/549,629, titled "FILTERS WITH BULK ACOUSTIC WAVE DEVICES," filed on even date herewith, the entire disclosure of which is hereby incorporated by reference herein.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
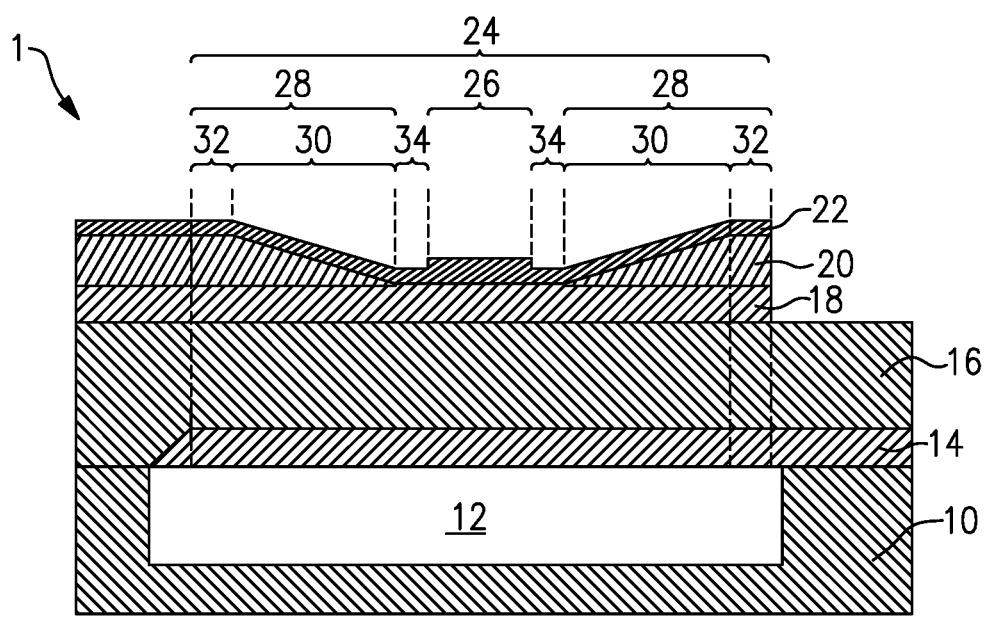
FIG. 1 is a schematic cross-sectional view of a bulk acoustic wave (BAW) device with a single-layer single-gradient raised frame structure.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Bulk acoustic wave (BAW) devices can include raised frame structures. A raised frame structure can reduce lateral energy leakage from a main acoustically active region of the bulk acoustic wave device. A BAW device can include a single-layer raised frame structure that can achieve a relatively high quality factor (Q) in a region below a resonant frequency (fs). The single-layer raised frame structure can include a single-layer gradient raised frame structure. The single-layer raised frame structure can include a single-layer multi-gradient (dual-gradient) raised frame structure. In certain BAW devices, the gradient (slope or taper) of the raised frame structure can be caused due to a manufacturing artifact. For example, the gradient may be formed during an etching process.

A BAW device can include a multi-layer raised frame structure that can achieve a relatively high Q in a region above a resonant frequency (fs) and an anti-resonant frequency (fp). The BAW device with a multi-layer raised frame structure can achieve low insertion loss and low Gamma loss. The multi-layer raised frame structure can include a multi-layer single-gradient raised frame structure. The multi-layer raised frame structure can include a multi-layer multi-gradient (dual-gradient) raised frame structure.

These different types of BAW devices have different structures and can involve different manufacturing processes. Embodiments disclosed herein relate to utilizing various types of BAW devices in a filter to achieve higher performance than a filter that implement a single type of BAW device. For example, a BAW device with a single-layer raised frame structure and a BAW device with a multi-layer raised frame structure can be used in a filter to achieve a relatively high Q at various frequency ranges including below and above the resonant frequency.

FIG. 1 is a schematic cross-sectional side view of a BAW device 1 with a single-layer single-gradient raised frame structure according to an embodiment. The BAW device 1 includes a support substrate 10, a cavity 12, a lower electrode 14 positioned over the support substrate 10, a piezoelectric layer 16 positioned over the lower electrode 14, an upper electrode 18 positioned over the piezoelectric layer 16, a raised frame structure 20 positioned over the upper electrode 18, and a passivation layer 22 positioned over the raised frame structure 20.

The support substrate 10 can be a silicon substrate. Other suitable substrates can alternatively be implemented in place of the silicon substrate. One or more layers, such as a passivation layer, can be positioned between the lower electrode 14 and the support substrate 10. The cavity 12 can be an air cavity.

The piezoelectric layer 16 can be an aluminum nitride (AlN) layer or any other suitable piezoelectric layer. An active region 24 or active domain of the BAW device 1 is defined by the portion of the piezoelectric layer 16 that overlaps with both the lower electrode 14 and the upper electrode 18 over an acoustic reflector, such as the cavity 12. The lower electrode 14 can have a relatively high acoustic impedance. For example, the lower electrode 14 can include molybdenum (Mo), tungsten (W), ruthenium (Ru), iridium (Ir), platinum (Pt), Ir/Pt, or any suitable alloy and/or combination thereof. Similarly, the upper electrode 18 can have a relatively high acoustic impedance. The upper electrode 18 can be formed of the same material as the lower electrode 14 in certain instances. In other instances, the lower electrode 14 and the upper electrode 18 can include different materials.

The illustrated BAW device 1 includes the active region 24 that has a main acoustically active region 26 and a frame region 28 on opposing sides of the main acoustically active region 26. The main acoustically active region 26 may be referred to as a center region of the active region 24. The main acoustically active region 26 can set the main resonant frequency of the BAW device 1. There can be a significant (e.g., exponential) fall off of acoustic energy in the piezoelectric layer 16 for a main mode in the frame region 28 relative to the main acoustically active region 26. In the frame region 28, there is a gradient region 30 and a non-gradient region 32. The raised frame structure 20 can be a metal raised frame in some embodiments. The raised frame structure 20 can be substantially parallel to the piezoelectric layer 16 in the non-gradient region 32. The second raised frame structure 20 has a non-gradient portion in the non-gradient region 32 and a gradient portion in the gradient region 30. The active region 24 can include a recessed frame region 34.

The raised frame structure 20 can include a relatively high density material. For instance, the raised frame structure 20 can include molybdenum (Mo), tungsten (W), ruthenium (Ru), platinum (Pt), iridium (Ir), the like, or any suitable alloy thereof. The raised frame structure 20 can be a metal layer. Alternatively, the raised frame structure 20 can be a suitable non-metal material with a relatively high density. The density of the raised frame structure 20 can be similar to or heavier than the density of an electrode 14, 18 of the BAW device 1. In some instances, the raised frame structure 20 can be of the same material as an electrode 14, 18 of the BAW device 1. The raised frame structure 20 can have a relatively high acoustic impedance. The frame region 28 can surround the main acoustically active region 26 in plan view.

The BAW device 1 illustrated in FIG. 1 can be particularly beneficial for achieving relatively high Q below a resonant frequency (fs). The recessed frame region 34 can contribute to achieving the relatively high Q below the fs. The raised frame structure 20 can contribute to achieving the relatively high Q below the fs. The combination of the recessed frame region 34 and the raised frame structure 20 of the BAW device 1 can contribute to achieving the relatively high Q below the fs.

Example BAW devices with multi-layer (e.g., dual-layer) raised frame structures will now be discussed. Any suitable principles and advantages of these BAW devices can be implemented together with each other.

Figure 2A:
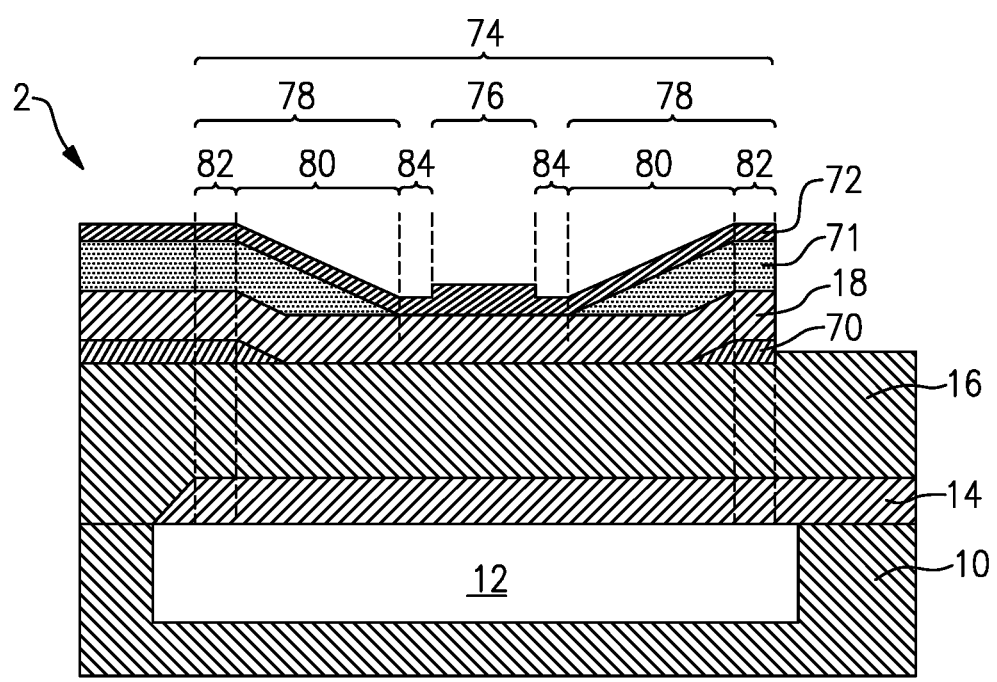
FIG. 2A is a cross sectional view of a multi-layer gradient raised frame BAW device.

FIG. 2A is a cross sectional side view of a multi-layer gradient raised frame bulk acoustic wave (BAW) device 2 according to an embodiment. As illustrated, the multi-layer gradient raised frame BAW device 2 includes a support substrate 10, a cavity 12, a lower electrode 14 positioned over the support substrate 10, a piezoelectric layer 16 positioned over the lower electrode 14, an upper electrode 18 positioned over the piezoelectric layer 16, a first raised frame structure 70 positioned at least partially between the piezoelectric layer 16 and the upper electrode 18, a second raised frame structure 71 positioned over the upper electrode 18, and a passivation layer 72 positioned over the second raised frame structure 71. The BAW device 2 is generally similar to the BAW device 1 of FIG. 1, except the BAW device 2 additionally includes the first raised frame structure 70 between the piezoelectric layer 16 and the upper electrode 18. The first raised frame structure 70 can also impact the geometry of overlying layers of the BAW device 2.

The illustrated BAW device 2 includes an active region 74 that has a main acoustically active region 76 and a frame region 78 on opposing sides of the main acoustically active region 76. The frame region 78 can surround the main acoustically active region 76 in a plan view. The main acoustically active region 76 may be referred to as a center region of the active region 74. The main acoustically active region 76 can set the main resonant frequency of the BAW device 2. There can be a significant (e.g., exponential) fall off of acoustic energy in the piezoelectric layer 16 for a main mode in the frame region 78 relative to the main acoustically active region 76. In the frame region 78, there is a gradient region 80 and a non-gradient region 82. The first raised frame structure 70 can reduce an effective electromechanical coupling coefficient ($k^2$) of the raised frame domain of the BAW device 2 relative to a similar device without the first raised frame structure 70, such as the BAW device 1 illustrated in FIG. 1. The second raised frame structure 71 can be a metal raised frame in some embodiments. The first raised frame structure 70 and the second raised frame structure 71 can be substantially parallel to the piezoelectric layer 16 in the non-gradient region 82. The second raised frame structure 71 has a non-gradient portion in the non-gradient region 82 and a gradient portion in the gradient region 80. The active region 74 can include a recessed region 84.

Figure 2B:
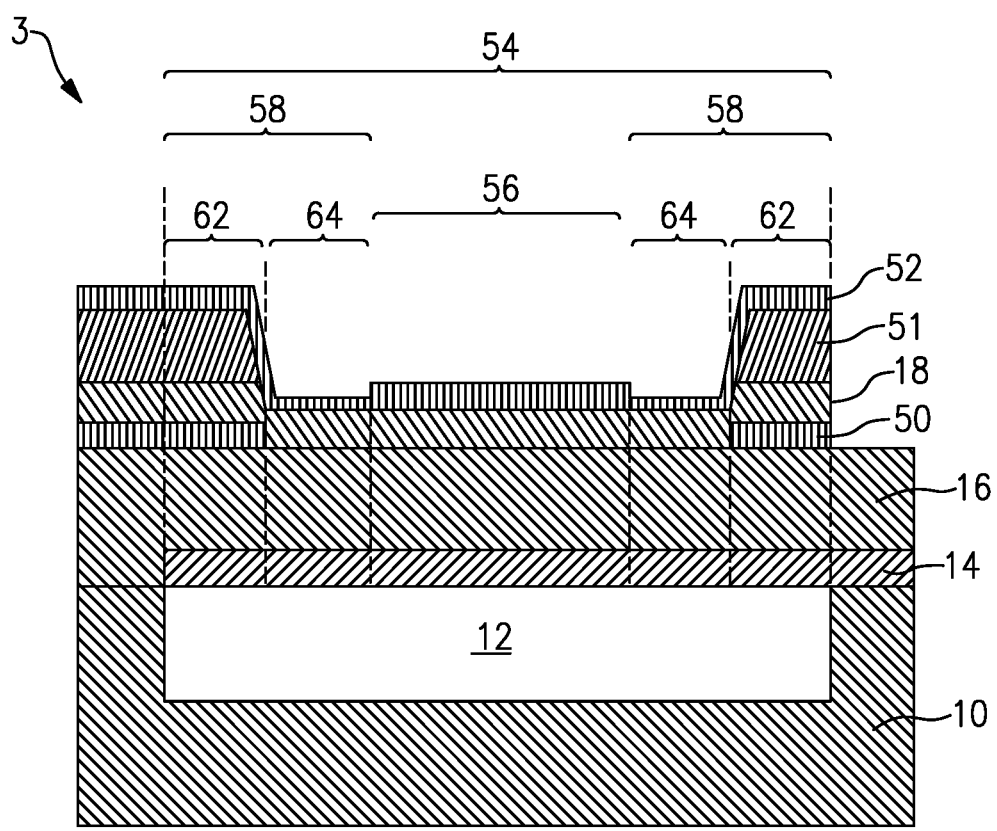
FIG. 2B is a cross sectional view of a multi-layer raised frame BAW device.

FIG. 2B is a cross-sectional side view of a multi-layer raised frame bulk acoustic wave (BAW) device 3 according to an embodiment. As illustrated, the multi-layer raised frame BAW device 3 includes a support substrate 10, a cavity 12, a lower electrode 14 positioned over the support substrate 10, a piezoelectric layer 16 positioned over the lower electrode 14, an upper electrode 18 positioned over the piezoelectric layer 16, a first raised frame structure 50 positioned at least partially between the piezoelectric layer 16 and the upper electrode 18, a second raised frame structure 51 positioned over the upper electrode 18, and a passivation layer 52 positioned over the second raised frame structure 51. The BAW device 3 is generally similar to the BAW device 2 illustrated in FIG. 2A, except in BAW device 2, the first raised frame structure 70 and the second raised frame structure 71 have a gradient.

The piezoelectric layer 16 is disposed between the lower electrode 14 and the upper electrode 18. The piezoelectric layer 16 can be an aluminum nitride (AlN) layer or any other suitable piezoelectric layer. An active region 54 or active domain of the BAW device 3 is defined by the portion of the piezoelectric layer 16 that overlaps with both the lower electrode 14 and the upper electrode 18 over an acoustic reflector, such as the cavity 12. The lower electrode 14 can have a relatively high acoustic impedance The dual raised frame structure of the BAW device 3 includes the first raised frame structure 50 and the second raised frame structure 51. The first raised frame structure 50 and the second raised frame structure 51 overlap with each other in the active region 54 of the BAW device 3. The active region 54 includes a main acoustically active region 56, and a frame region 58. The frame region 58 includes a raised frame region 62 and a recessed frame region 64. The raised frame region 62 of the BAW device 3 is defined by the portion of dual raised frame structure in the active region 54 of the BAW device 3. At least a portion of the dual raised frame structure is included in an active region 54 of the BAW device 3. The dual raised frame structure can improve Q significantly due to highly efficient reflection of lateral energy. The dual raised frame structure can achieve a relatively high Q above a resonant frequency (fs) and an anti-resonant frequency (fp).

The first raised frame structure 50 is positioned between the lower electrode 14 and the upper electrode 18. As illustrated in FIG. 2B, the first raised frame structure 50 is positioned between the piezoelectric layer 16 and the upper electrode 18. The first raised frame structure 50 includes and/or consists essentially of a low acoustic impedance material. The low acoustic impedance material can have a lower acoustic impedance than the lower electrode 14. The low acoustic impedance material can have a lower acoustic impedance than the upper electrode 18. The low acoustic impedance material can have a lower acoustic impedance than the piezoelectric layer 16. As an example, the first raised frame structure 50 can be a silicon dioxide ($SiO_2$) layer. Because silicon dioxide is already used in a variety of bulk acoustic wave devices, a silicon dioxide first raised frame structure 50 can be relatively easy to manufacture. The first raised frame structure 50 can be a silicon nitride (SiN) layer, a silicon carbide (SiC) layer, or any other suitable low acoustic impedance layer. The first raised frame structure 50 can have a relatively low density. The first raised frame structure 50 can extend beyond the active region of the BAW device 3 as shown in FIG. 2B. This can be for manufacturability reasons in certain instances.

The first raised frame structure 50 can reduce an effective electromechanical coupling coefficient ($k^2$) of the raised frame domain of the BAW device 3 relative to a similar device without the first raised frame structure 50. This can reduce excitation strength of a raised frame spurious mode. Moreover, the first raised frame structure 50 can contribute to move the frequency of the raised frame mode relatively far away from the main resonant frequency of the BAW device 3, which can result in no significant effect on a Gamma loss.

As illustrated, the second raised frame structure 51 overlaps with the first raised frame structure 50 in the active region 54 of the BAW device 3. The second raised frame structure 51 can be the same material as the upper electrode 18. This can be convenient from a manufacturing perspective. The second raised frame structure 51 can be a relatively high density material. For instance, the second raised frame structure 51 can include molybdenum (Mo), tungsten (W), ruthenium (Ru), the like, or any suitable alloy thereof. The second raised frame structure 51 can be a metal layer. Alternatively, the second raised frame structure 51 can be a suitable non-metal material with a relatively high density. The density of the second raised frame structure 51 can be similar or heavier than the density of the upper electrode 18. The second raised frame structure 51 can have a relatively high acoustic impedance.

The second raised frame structure 51 increases the height of the BAW device 3 in the raised frame domain. Accordingly, the BAW device 3 has a greater height in the raised frame domain than in other portions of the active domain, such as the middle area of the active domain. Forming the second raised frame structure 51 over the upper electrode 18 can be relatively easy from a manufacturing perspective. However, in some other embodiments, a second raised frame layer can be included in a different position in the stack of layers in the raised frame domain.

In the BAW device 3, a passivation layer 52 is included over the upper electrode 18 and the second raised frame structure 51. The passivation layer 52 can be a silicon dioxide layer. The passivation layer 52 can be formed with different thicknesses in different regions of the BAW device 3. For example, as shown in FIG. 2B, the passivation layer 52 is thinner in a recessed frame domain or the recessed frame region 64. Any suitable passivation layer can be included in the passivation layer 52.

The dual raised frame BAW device 3 is an FBAR. The cavity 12 (e.g., an air cavity) is included below the lower electrode 14. The cavity 12 is defined by the geometry of the lower electrode 14 and the support substrate 10. One or more layers, such as a passivation layer, can be positioned between the lower electrode 14 and the support substrate 10.

Figure 3A:
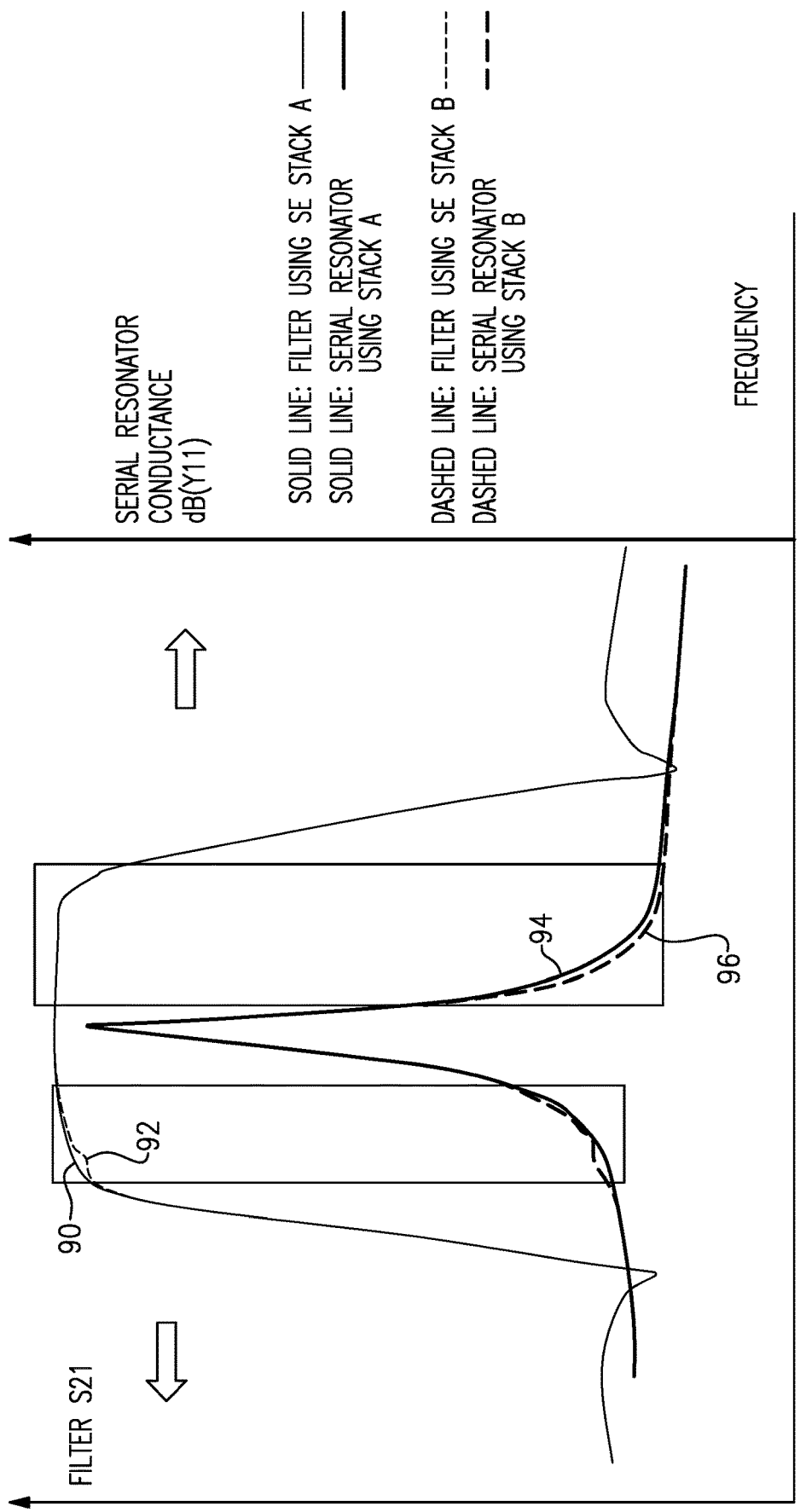
FIG. 3A is a graph showing results of simulated conductance and frequency responses for a resonator and a filter with the BAW device illustrated in FIG. 1 and the BAW device illustrated in FIG. 2A as series resonators.

FIG. 3A is a graph showing results of simulated conductance dB(Y11) and frequency responses (S21) for a resonator and a filter with the BAW device 1 illustrated in FIG. 1 and the BAW device 2 illustrated in FIG. 2A as series resonators. A solid line 90 shows the filter response of the filter using the BAW device 1 as a series resonator. A dashed line 92 shows the filter response of the BAW device 2 as the series resonator. A solid line 94 shows the conductance of the BAW device 1 as the series resonator. A dashed line 96 shows the conductance of the BAW device 2 as the series resonator. The results indicate that a higher Q can be obtained below a resonant frequency in the filter and the resonator that utilize the BAW device 1 than the filter and the resonator that utilize the BAW device 2. The results indicate that a higher Q can be obtained above the resonant frequency in the filter and the resonator that utilize the BAW device 2 than the filter and the resonator that utilize the BAW device 1.

Figure 3B:
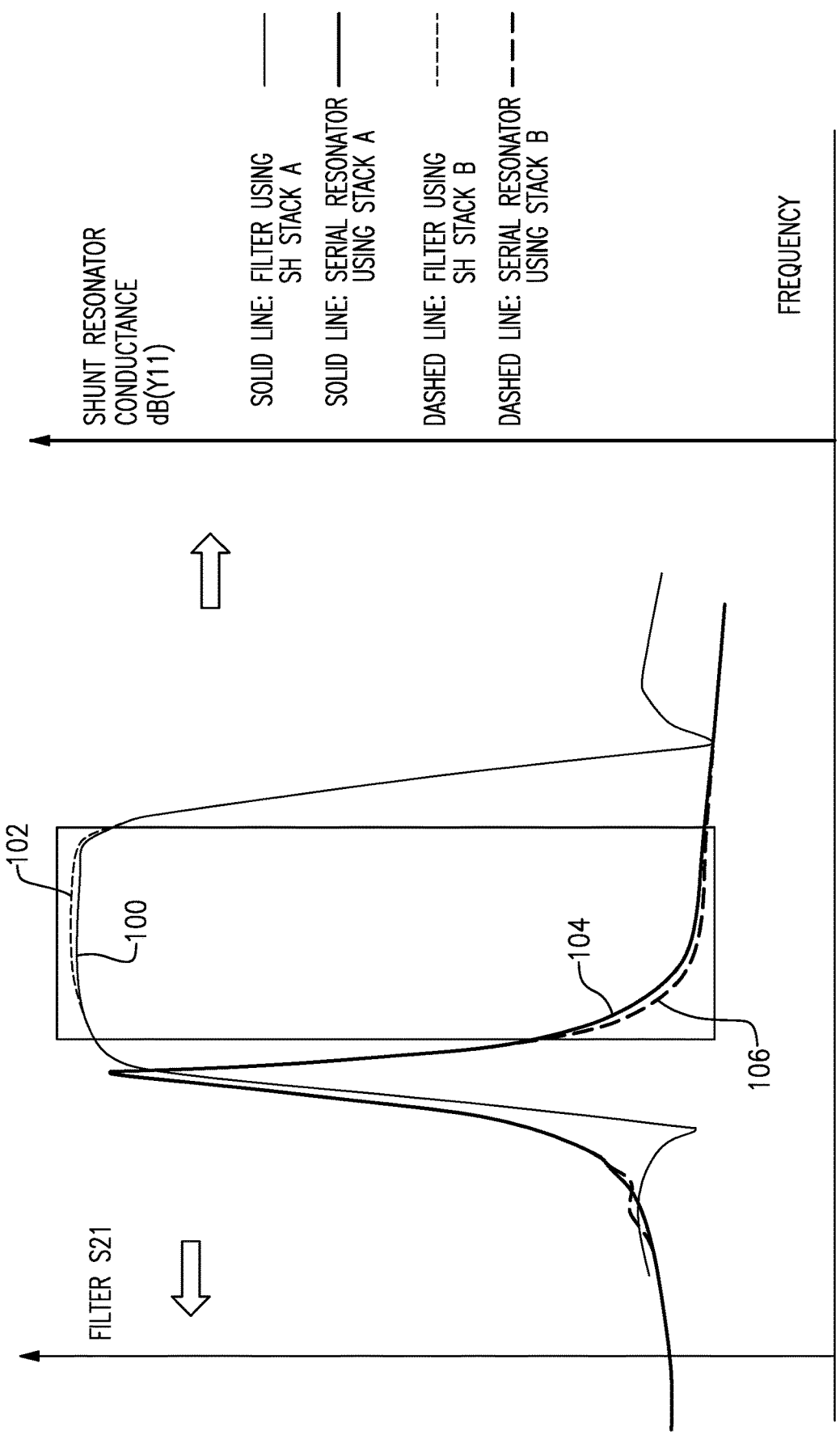
FIG. 3B is a graph showing results of simulated conductance and frequency responses for a resonator and a filter that have shunt configurations using the BAW device illustrated in FIG. 1 and the BAW device illustrated in FIG. 2A.

FIG. 3B is a graph showing results of simulated conductance dB(Y11) and frequency responses (S21) for a resonator and a filter that have shunt configurations using the BAW device 1 illustrated in FIG. 1 and the BAW device 2 illustrated in FIG. 2A. A solid line 100 shows the filter response of the filter using the BAW device 1 as a series resonator. A dashed line 102 shows the filter response of the BAW device 2 as the series resonator. A solid line 104 shows the conductance of the BAW device 1 as the series resonator. A dashed line 106 shows the conductance of the BAW device 2 as the series resonator. The results indicate that a higher Q can be obtained below a resonant frequency in the filter and the resonator that utilize the BAW device 1 than the filter and the resonator that utilize the BAW device 2. The results indicate that a higher Q can be obtained above the resonant frequency in the filter and the resonator that utilize the BAW device 2 than the filter and the resonator that utilize the BAW device 1.

These different characteristics can be the BAW device 2 having a multi-layer (e.g., dual-layer) raised frame structure and the BAW device 1 has a raised frame structure with at least one less layer (e.g., a single-layer) than the BAW device 2. Accordingly, it can be beneficial to include a combination of BAW devices that have structural differences, such as different raised frame structures, and include the BAW devices in particular locations of a filter topology to achieve better performances at different frequencies.

In some embodiments, a filter can include a first BAW device that has a first raised frame structure and a second BAW device that has a second raised frame structure. The first raised frame structure can include a multi-layer (e.g., a dual-layer) raised frame structure that has multiple mass loading layers, and the second raised frame structure can include at least one less mass loading layer than the first raised frame structure. The second raised frame structure can be a single-layer raised frame structure. The second raised frame structure can provide a less mass loading than the first raised frame structure. The first BAW device with the first raised frame structure can have a cleaner frequency response relatively far away from the resonant frequency (fs) than the second BAW device with the second raised frame structure. For example, a band pass filter can include at least one series BAW resonator that has the first raised frame structure and at least one shunt BAW resonator that has the second raised frame structure. As another example, a band rejection filter can include at least one series BAW resonator that has the second raised frame structure and at least one shunt BAW resonator that has the first raised frame structure.

Figure 4A:
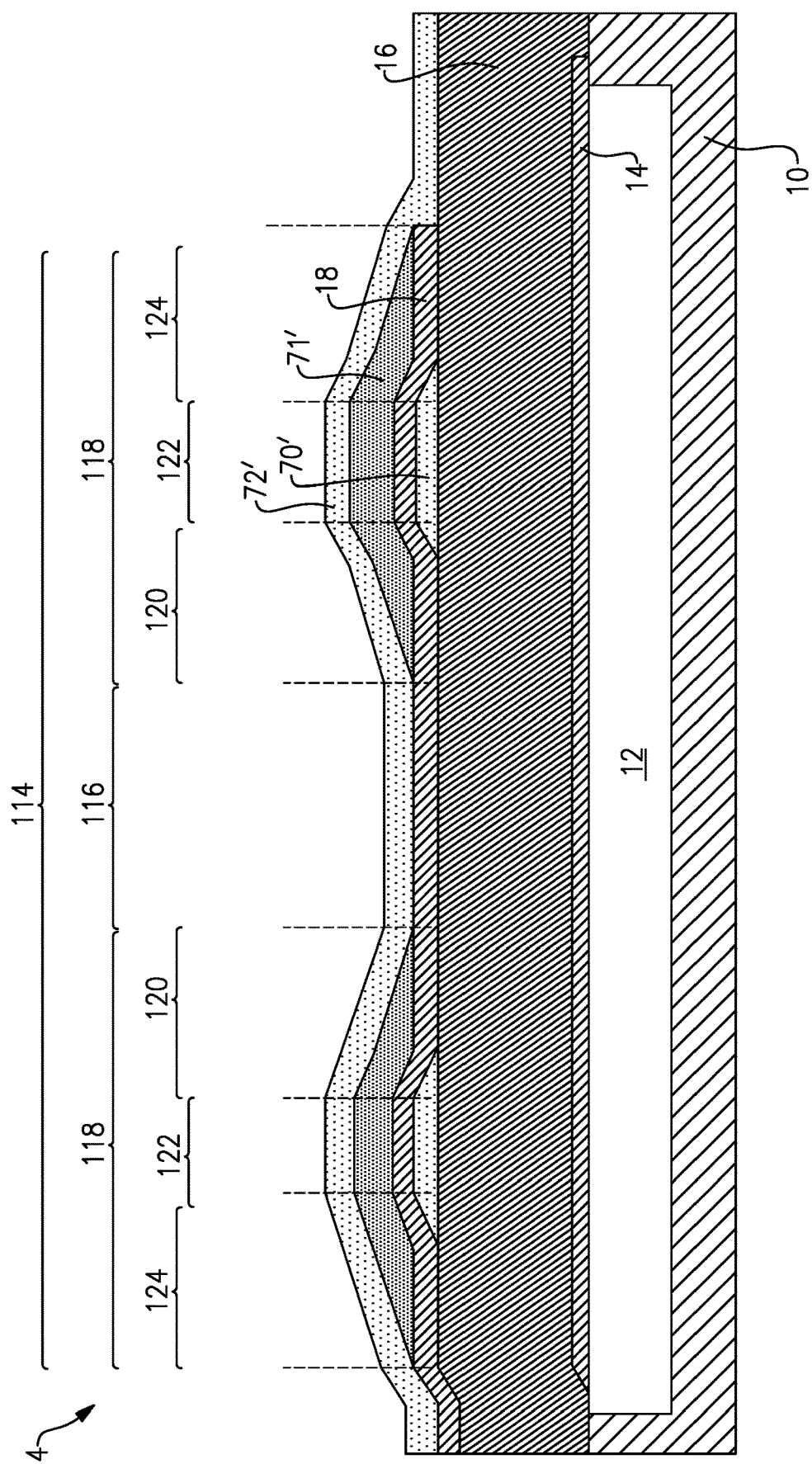
FIG. 4A is a schematic cross-sectional view of a BAW device with a dual gradient raised frame structure.
Figure 4B:
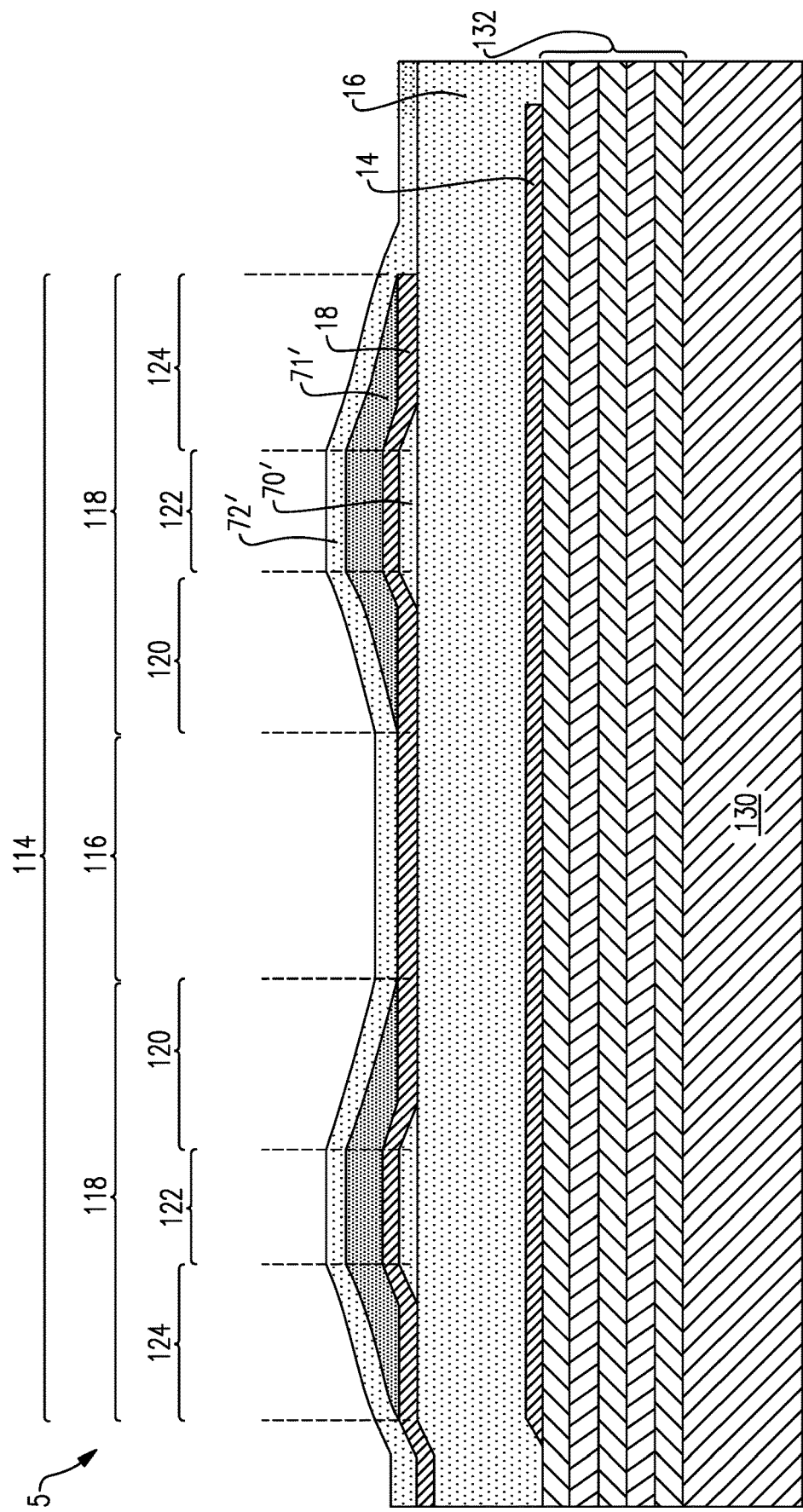
FIG. 4B illustrates a BAW solidly mounted resonator with a dual gradient raised frame structure.

FIGS. 4A and 4B are cross-sectional side views of embodiments of BAW devices 4, 5 with multi-gradient raised frame structures. Any suitable combination of features of these embodiments can be implemented together with each other and/or other embodiments disclosed herein. For example, one or more BAW devices with a multi-gradient raised frame structure can be included in a filter in accordance with any suitable principles and advantages disclosed herein.

FIG. 4A is a schematic cross-sectional side view of a BAW device 4 with a dual gradient raised frame structure according to an embodiment. The device 4 has an active region 114 that includes a main acoustically active region 116 and frame region 118. As illustrated, the frame region 118 is a raised frame region. One or more recessed frame regions can also be included. The frame region 118 can be positioned on opposing sides of the main acoustically active region 116 in the illustrated cross-sectional view. There can be a significant (e.g., exponential) fall off of acoustic energy in the piezoelectric layer 16 for a main mode in the frame region 118 relative to the main acoustically active region 116. In the frame region 118, there is a first gradient region 120, a non-gradient region 122, and a second gradient region 124. The first raised frame structure 70' (e.g., an oxide layer) and the second raised frame structure 71' (e.g., a metal layer) are both substantially parallel to the piezoelectric layer 16 in the non-gradient region 122. The second raised frame structure 71' is tapered and extends beyond the first raised frame structure 70' in the first and second gradient regions 120, 124. The second raised frame structure 71' has a non-gradient portion in the non-gradient region 122 and gradient portions in the gradient regions 120, 124. A passivation layer 72' can be positioned over the second raised frame structure 71'.

Although embodiments disclosed herein include dual gradient raised frame structures, any suitable principles and advantages disclosed herein can be implemented in BAW devices with three or more gradient regions. While the frame region 118 of FIG. 4A includes two gradient regions 120, 124 and a non-gradient region 122 between the gradient regions 120, 124, some other multi-gradient raised frame structures (e.g., raised frame structures with relatively narrow width) can include gradient regions without a non-gradient region. Accordingly, a multi-gradient raised frame structure can consist of or consist essentially of gradient regions.

Any suitable principles and advantages disclosed herein can be applied to floating raised frame structures where a raised frame structure is at a floating voltage level. The floating raised frame structure can be electrically isolated from the electrodes of the BAW device (e.g., by a dielectric material).

The BAW devices 1-4 of FIGS. 1, 2A, 2B, and 4A are examples of film bulk acoustic resonators (FBARs). Any suitable principles and advantages disclosed herein can be applied to other BAW devices. FIG. 4B illustrates a bulk acoustic wave solidly mounted resonator (BAW-SMR) 5 with a dual gradient raised frame structure. The BAW-SMR 5 includes a solid acoustic mirror 132 positioned over a support substrate 130 in place of an air cavity as an acoustic reflector below a lower electrode 14. Any suitable principles and advantages disclosed herein can be applied to SMRs.

BAW devices can include a multi-layer raised frame structure with a plurality of gradients. The multi-layer raised frame structure can include a first raised frame layer positioned between a lower electrode and an upper electrode of a BAW device. The multi-layer raised frame structure can also include a second raised frame layer positioned over the first raised frame layer. The second raised frame layer can extend beyond the first raised frame layer. The second raised frame layer can be tapered on opposing sides where the second raised frame layer extends beyond the first raised frame layer. Tapered portions of the second raised frame layer can have a taper angle that is less than 90 degrees. The multi-layer raised frame structure can have a convex structure relative to a surface of a piezoelectric layer and/or an electrode layer. The multi-layer raised frame structure can form a dome shaped structure. The multi-layer raised frame structure can surround a main acoustically active region of a BAW acoustic wave device in a plan view.

Figure 5:
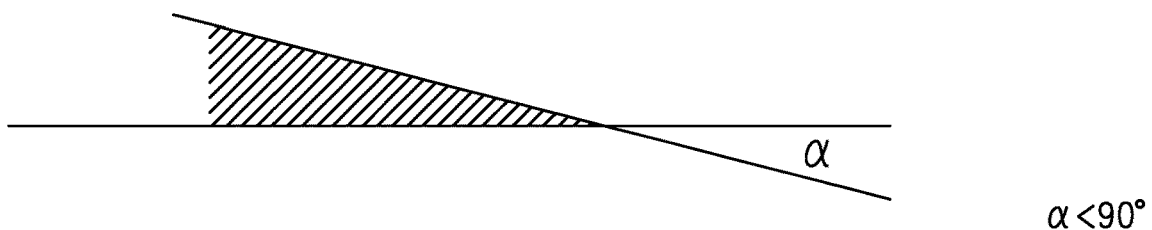
FIG. 5 illustrates a taper angle $\alpha$ of a gradient raised frame.

A gradient portion of a raised frame layer can have a taper angle α with respect to a horizontal direction in the illustrated schematic cross-sectional views. The taper angle α can be with respect to an underlying layer (e.g., a piezoelectric layer). FIG. 5 illustrates a taper angle α. The taper angle α can be less than 90°. In some applications, the taper angle can be less than 40° for a gradient portion of a raised frame layer in a gradient region. In some instances, the taper angle can be in a range from about 10° to 30° for a gradient portion of a raised frame layer in a gradient region.

BAW devices disclosed herein can be implemented in acoustic wave filters. In certain applications, the acoustic wave filters can be band pass filters arranged to pass a radio frequency band and attenuate frequencies outside of the radio frequency band. Acoustic wave filters can implement band rejection filters. Two or more acoustic wave filters can be coupled together at a common node and arranged as a multiplexer, such as a duplexer. Example filter topologies include a ladder filter, a lattice filter, and a hybrid ladder lattice filter, and the like. An acoustic wave filter can include all BAW devices or one or more BAW devices and one or more other types of acoustic wave resonators such as a SAW resonator. BAW devices disclosed herein can be implemented in a filter that includes at least one BAW devices and a non-acoustic inductor-capacitor component.

Figure 6:
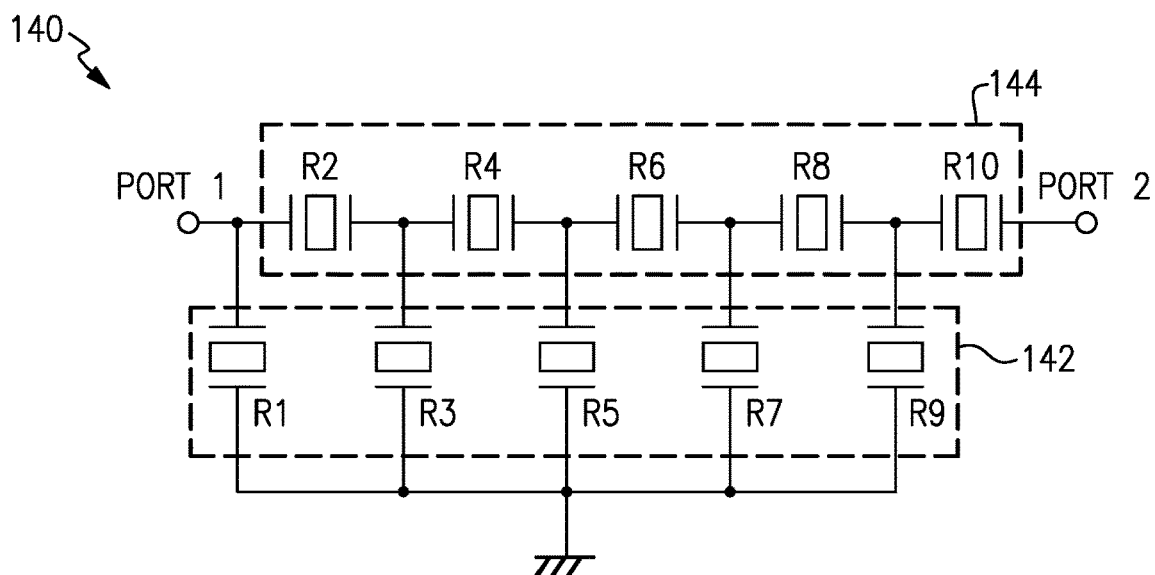
FIG. 6 is a schematic diagram of a ladder filter according to an embodiment.

FIG. 6 is a schematic diagram of a ladder filter 140 according to an embodiment. The ladder filter 140 includes shunt BAW resonators 142 and series BAW resonators 144 coupled between RF input/output ports Port1 and Port2. The ladder filter 140 is an example topology of a band pass filter formed from acoustic resonators. In a band pass filter with a ladder filter topology, the shunt resonators can have lower resonant frequencies than the series resonators. The ladder filter 140 can be arranged to filter an RF signal. As illustrated, the shunt BAW resonators include resonators R1, R3, R5, R7, and R9. The illustrated series BAW resonators 144 include resonators R2, R4, R6, R8, and R10. The first RF input/output port Port1 can be a transmit port for a transmit filter or a receive port for a receive filter. The second RF input/output port Port2 can be an antenna port. Any suitable number of series acoustic resonators can be included in a ladder filter. Any suitable number of shunt acoustic wave resonators can be included in a ladder filter.

In a band pass filter, the resonators R1, R3, R5, R7, and R9 can include at least one first type BAW resonator that includes a first raised frame structure and the resonators R2, R4, R6, R8, and R10 can include at least one second type BAW resonator that includes a second raised frame structure. In a band rejection filter, the resonators R2, R4, R6, R8, and R10 can include at least one first type BAW resonator that includes a first raised frame structure and the resonators R1, R3, R5, R7, and R9 can include at least one second type BAW resonator that include a second raised frame structure. The second raised frame structure is different than the first raised frame structure. The first raised frame structure has at least one more raised frame layer than the second raised frame structure. The series bulk acoustic wave resonator has a second resonant frequency and a second anti-resonant frequency. The second raised frame structure contributes to the series bulk acoustic wave resonator having a higher quality factor below the second resonant frequency than the shunt bulk acoustic wave resonator has below the first resonant frequency.

Figure 7:
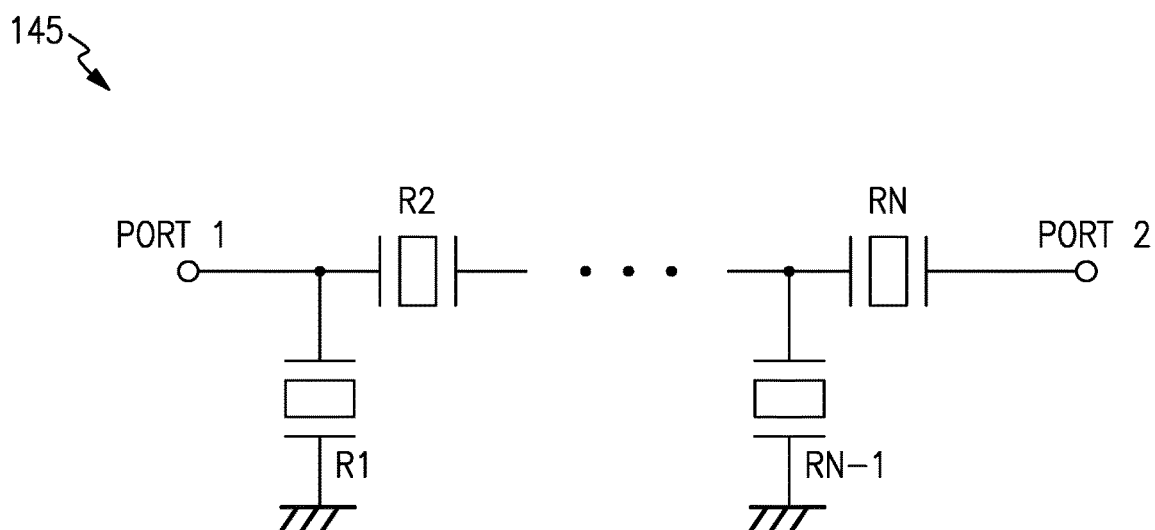
FIG. 7 is a schematic diagram of a ladder filter according to another embodiment.

FIG. 7 is a schematic diagram of a ladder filter 145 according to another embodiment. The ladder filter 145 includes a plurality of acoustic resonators R1, R2, ..., RN-1, and RN arranged between a first input/output port PORT1 and a second input/output port PORT1. One of the input/output ports PORT1 or PORT2 can be an antenna port. In certain instances, the other of the input/output ports PORT1 or PORT2 can be a receive port. In some other instances, the other of the input/output ports PORT1 or PORT2 can be a transmit port.

The ladder filter 145 illustrates that any suable number of ladder stages can be implemented in a ladder filter in accordance with any suitable principles and advantages disclosed herein. Ladder stages can start with a series resonator or a shunt resonator from any input/output port of the ladder filter 145 as suitable. As illustrated, the first ladder stage from the input/output port PORT1 begins with a shunt resonator R1. As also illustrated, the first ladder stage from the input/output port PORT2 begins with a series resonator RN.

The ladder filter 145 includes shunt resonators R1 and RN-1 and series resonator R2 and RN. The series resonators of the ladder filter 145 including resonators R2 and RN can be acoustic resonators of a first type that have higher Q than series resonators of a second type in a frequency range below fs. The shunt resonators of the ladder filter 145 including resonators R1 and RN-1 can be acoustic resonators of the second type and have higher Q than shunt resonators of the first type in a frequency range between fs and fp. This can lead to a reduced insertion loss. The ladder filter 145 can be a band pass filter with series resonators of the first type and shunt resonators of the second type. In some other embodiments, the series resonators of the ladder filter 145 including resonators R2 and RN can be acoustic resonators of the second type and the shunt resonators of the ladder filter 145 including resonators R1 and RN-1 can be acoustic resonators of the first type. In such embodiments, the ladder filter 145 can be a band pass filter.

The resonators of the first type can be BAW resonators that include a raised frame structure and the resonators of the second type can be BAW resonators that include a different raised frame structure. Accordingly, the ladder filter 145 can include series BAW resonators and shunt BAW resonators in certain embodiments. Such BAW resonators can include FBARs and/or solidly mounted resonators (SMRs).

In a band pass filter with a ladder filter topology, such as an acoustic wave filter, the shunt resonators can have lower resonant frequencies than the series resonators. In certain embodiments, the shunt resonators of the acoustic wave filter 145 are BAW resonators that include a raised frame structure and the series resonators of the acoustic wave filter 145 are BAW resonators that include a different raised frame structure that has less mass loading than the raised frame structure of the shunt BAW resonators. In such embodiments, the acoustic wave filter 145 can be a band pass filter. Such a band pass filter can achieve low insertion loss at both a lower band edge and an upper band edge of a passband.

In a band stop filter with a ladder filter topology, such as an acoustic wave filter, the shunt resonators can have higher resonant frequencies than the series resonators. In certain embodiments, the acoustic wave filter 145 is a band stop filter, the shunt resonators of the acoustic wave filter 145 are BAW resonators that include a raised frame structure and the series resonators of the acoustic wave filter 145 are BAW resonators that include a different raised frame structure that has a greater mass loading function than the raised frame structure of the shunt BAW resonators. Such a band stop filter can achieve desirable characteristics in a stop band of the band stop filter.

BAW devices disclosed herein can be implemented in a variety of packaged modules. Example packaged modules include one or more acoustic wave filters and one or more radio frequency amplifiers (e.g., one or more power amplifiers and/or one or more low noise amplifiers) and/or one or more radio frequency switches.

One or more filters with any suitable number of BAW devices implemented with any suitable principles and advantages disclosed herein can be included in a variety of wireless communication devices, such as mobile phones. The BAW devices can be included in a filter of a radio frequency front end.

Figure 8A:
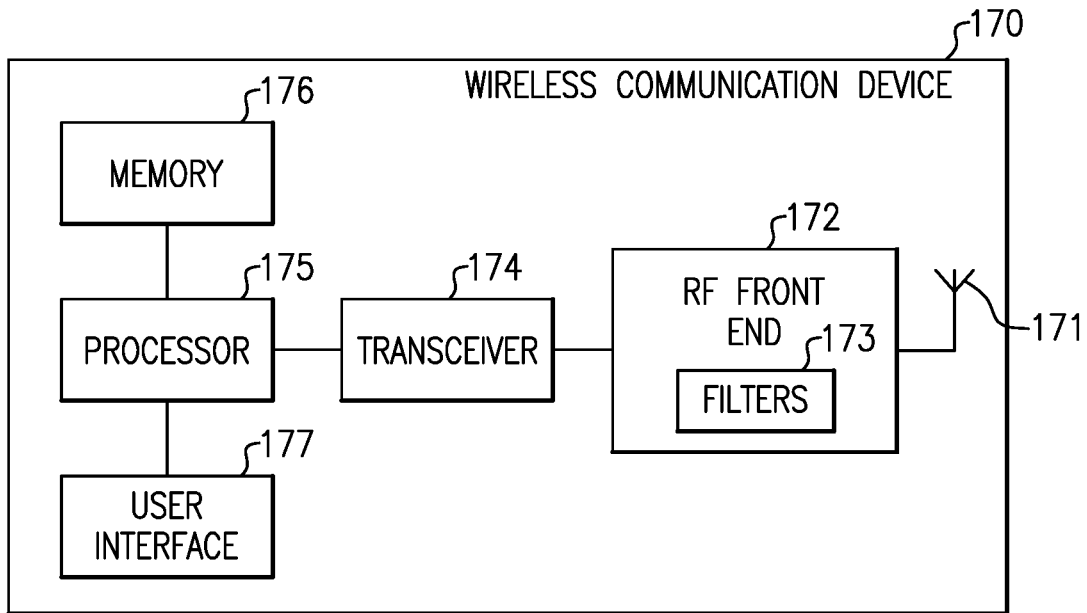
FIG. 8A is a schematic block diagram of a wireless communication device that includes a filter with two types of bulk acoustic wave resonators.

One or more filters with any suitable number of multi-layer raised frame bulk acoustic devices can be implemented in a variety of wireless communication devices. FIG. 8A is a schematic block diagram of a wireless communication device 170 that includes a filter 173 with two types of bulk acoustic wave resonators in accordance with any suitable principles and advantages disclosed herein. The wireless communication device 170 can be any suitable wireless communication device. For instance, a wireless communication device 170 can be a mobile phone, such as a smart phone. As illustrated, the wireless communication device 170 includes an antenna 171, a radio frequency (RF) front end 172 that includes filter 173, an RF transceiver 174, a processor 175, a memory 176, and a user interface 177. The antenna 171 can transmit RF signals provided by the RF front end 172. The antenna 171 can provide received RF signals to the RF front end 172 for processing.

The RF front end 172 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 172 can transmit and receive RF signals associated with any suitable communication standards. Any suitable combination of the bulk acoustic wave resonators disclosed herein can be implemented in filters 173 of the RF front end 172.

The RF transceiver 174 can provide RF signals to the RF front end 172 for amplification and/or other processing. The RF transceiver 174 can also process an RF signal provided by a low noise amplifier of the RF front end 172. The RF transceiver 174 is in communication with the processor 175. The processor 175 can be a baseband processor. The processor 175 can provide any suitable base band processing functions for the wireless communication device 170. The memory 176 can be accessed by the processor 175. The memory 176 can store any suitable data for the wireless communication device 170. The processor 175 is also in communication with the user interface 177. The user interface 177 can be any suitable user interface, such as a display.

Figure 8B:
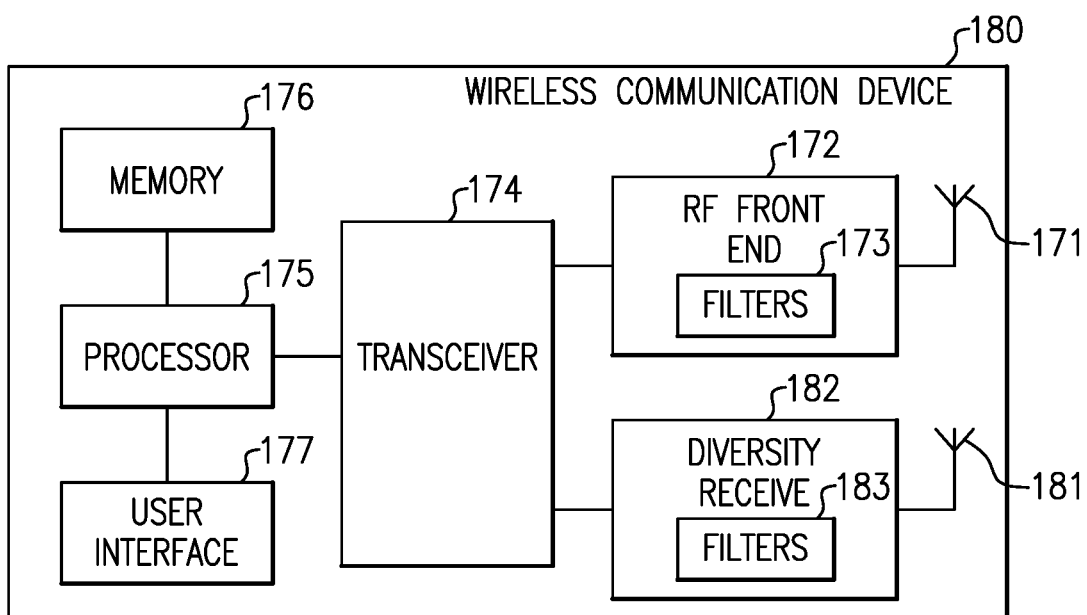
FIG. 8B is a schematic diagram of a wireless communication device that includes filters in a radio frequency front end and second filters in a diversity receive module.

FIG. 8B is a schematic diagram of a wireless communication device 180 that includes filters 173 in a radio frequency front end 172 and second filters 183 in a diversity receive module 182. The wireless communication device 180 is like the wireless communication device 170 of FIG. 8A, except that the wireless communication device 180 also includes diversity receive features. As illustrated in FIG. 8B, the wireless communication device 180 includes a diversity antenna 181, a diversity module 182 configured to process signals received by the diversity antenna 181 and including filters 183, and a transceiver 174 in communication with both the radio frequency front end 172 and the diversity receive module 182. One or more of the second filters 183 can include a bulk acoustic wave resonator with a multi-layer raised frame structure in accordance with any suitable principles and advantages disclosed herein.

Bulk acoustic wave devices disclosed herein can be included in a filter and/or a multiplexer arranged to filter a radio frequency signal in a fifth generation (5G) New Radio (NR) operating band within Frequency Range 1 (FR1). FR1 can from 410 megahertz (MHz) to 7.125 gigahertz (GHz), for example, as specified in a current 5G NR specification. Bulk acoustic wave devices disclosed herein can be included in a filter and/or a multiplexer arranged to filter a radio frequency signal in a fourth generation (4G) Long Term Evolution (LTE) operating band. Bulk acoustic wave devices disclosed herein can be included in a filter with a passband that spans an LTE band and a NR band. Such a filter can be implemented in a dual connectivity application, such as an E-UTRAN New Radio-Dual Connectivity (ENDC) application.

5G NR carrier aggregation specifications can present technical challenges. For example, 5G carrier aggregations can have wider bandwidth and/or channel spacing than fourth generation (4G) Long Term Evolution (LTE) carrier aggregations. Carrier aggregation bandwidth in certain 5G FR1 applications can be in a range from 120 MHz to 400 MHz, such as in a range from 120 MHz to 200 MHz. Carrier spacing in certain 5G FR1 applications can be up to 100 MHz. Bulk acoustic wave resonators with a multi-layer raised frame structure disclosed herein can achieve low insertion loss and low Gamma loss. The frequency of a raised frame mode of such a bulk acoustic wave resonator can be moved significantly away from a resonant frequency of the bulk acoustic wave resonator. Accordingly, the raised frame mode can be outside of a carrier aggregation band even with the wider carrier aggregation bandwidth and/or channel spacing within FR1 in 5G specifications. This can reduce and/or eliminate Gamma degradation in an operating band of another carrier of a carrier aggregation. In some instances, Gamma can be increased in the operating band of the other carrier of the carrier aggregation.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context indicates otherwise, throughout the description and the claims, the words "comprise," "comprising," "include," "including" and the like are to generally be construed in an inclusive sense, as opposed to an exclusive or exhaustive sense; that is to say, in the sense of "including, but not limited to." Conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively.

While certain embodiments have been described, these embodiments have been presented by way of example only, and are not intended to limit the scope of the disclosure. Indeed, the novel resonators described herein may be embodied in a variety of other forms. Furthermore, various omissions, substitutions and changes in the form of the resonators described herein may be made without departing from the spirit of the disclosure. Any suitable combination of the elements and/or acts of the various embodiments described above can be combined to provide further embodiments. The accompanying claims and their equivalents are intended to cover such forms or modifications as would fall within the scope and spirit of the disclosure.

What is claimed is:

1. A filter with bulk acoustic wave devices, the filter comprising:
   a first bulk acoustic wave resonator including a first raised frame structure within an active region, the first raised frame structure being a multi-layer raised frame structure having a multi-gradient raised frame structure; and
   a second bulk acoustic wave resonator including a second raised frame structure within the active region, the first raised frame structure having at least one more raised frame layer than the second raised frame structure, the first and second raised frame structures increase reflection of lateral energy within the active region.

2. The filter of claim 1 wherein the second raised frame structure is a single layer raised frame structure.

3. The filter of claim 1 wherein the first raised frame structure has a first mass loading and the second raised frame structure has a second mass loading region that is less than the first mass loading.

4. The filter of claim 1 wherein the first bulk acoustic wave resonator includes a first electrode, a second electrode, and a piezoelectric layer positioned between the first electrode and the second electrode; the first raised frame structure including a first layer positioned between the second electrode and the piezoelectric layer.

5. The filter of claim 4 wherein a second layer of the first raised frame structure is positioned over the second electrode such that the second electrode is positioned between the first layer and the second layer, and the first layer includes an oxide and the second layer includes a metal.

6. The filter of claim 4 wherein the first layer has a lower acoustic impedance than the piezoelectric layer.

7. The filter of claim 1 wherein the filter is a band pass filter.

8. The filter of claim 7 wherein the first bulk acoustic wave resonator is a shunt resonator and the second bulk acoustic wave resonator is a series resonator.

9. The filter of claim 8 further comprising a plurality of shunt bulk acoustic wave resonators including the first bulk acoustic wave resonator, and a plurality of series resonators coupled to the second bulk acoustic wave resonator.

10. The filter of claim 1 wherein the filter is a band rejection filter.

11. The filter of claim 10 wherein the first bulk acoustic wave resonator is a series resonator and the second bulk acoustic wave resonator is a shunt resonator.

12. The filter of claim 11 further comprises a plurality of series bulk acoustic wave resonators including the first bulk acoustic wave resonator, and a plurality of shunt resonators coupled to the second bulk acoustic wave resonator.

13. The filter of claim 1 wherein the first raised frame structure includes an oxide layer that is in contact with a piezoelectric layer of the first bulk acoustic wave resonator, and the second raised frame structure does not include a further oxide layer that is in contact with a piezoelectric layer in an active region of the second bulk acoustic wave resonator.

14. The filter of claim 1 wherein the first bulk acoustic wave resonator includes a recessed frame structure between a main acoustically active region and the first raised frame structure.

15. The filter of claim 1 wherein the second bulk acoustic wave resonator includes a recessed frame structure between a main acoustically active region and the second raised frame structure.

16. A radio frequency module comprising:
    a filter comprising:
    a first bulk acoustic wave resonator including a first raised frame structure, the first raised frame structure being a multi-layer raised frame structure; and
    a second bulk acoustic wave resonator including a second raised frame structure, the first raised frame structure having at least one more raised frame layer than the second raised frame structure; and
a radio frequency circuit element coupled to the filter, the filter and the radio frequency circuit element being enclosed within a common package.

17. The radio frequency module of claim 16 wherein the radio frequency circuit element is a radio frequency amplifier arranged to amplify a radio frequency signal.

18. The radio frequency module of claim 16 wherein the radio frequency circuit element is a switch configured to selectively couple the filter to an antenna port of the radio frequency module.

19. A wireless communication device comprising:
a filter comprising:
a first bulk acoustic wave resonator including a first raised frame structure, the first raised frame structure being a multi-layer raised frame structure; and
a second bulk acoustic wave resonator including a second raised frame structure, the first raised frame structure having at least one more raised frame layer than the second raised frame structure;
an antenna operatively coupled to the filter;
a radio frequency amplifier operatively coupled to the filter and configured to amplify a radio frequency signal; and
a transceiver in communication with the radio frequency amplifier.

20. The wireless communications device of claim 19 wherein the filter is a band pass filter or a band rejection filter, wherein, when the filter is the band pass filter, the first bulk acoustic wave resonator is a shunt resonator and the second bulk acoustic wave resonator is a series resonator, and wherein, when the filter is the band rejection filter, the first bulk acoustic wave resonator is a series resonator and the second bulk acoustic wave resonator is a shunt resonator.

\* \* \* \* \*